United States Patent

Comino et al.

[11] Patent Number: 5,877,645
[45] Date of Patent: Mar. 2, 1999

[54] OFFSET COMPENSATION CIRCUIT FOR INTEGRATED LOGARITHMIC AMPLIFIERS

[75] Inventors: Vittorio Comino, Keansburg; Dima David Shulman, Marlboro; Susan Jeanne Walker, Howell, all of N.J.

[73] Assignee: Lucent Technologies Inc., Murray Hill, N.J.

[21] Appl. No.: 908,573

[22] Filed: Aug. 8, 1997

[51] Int. Cl.[6] ............................. H03G 11/08; H03L 5/00
[52] U.S. Cl. .......................... 327/350; 327/307; 327/362
[58] Field of Search .................................. 327/350, 351, 327/352, 307, 362

[56] References Cited

U.S. PATENT DOCUMENTS

| | | | |
|---|---|---|---|
| 5,451,895 | 9/1995 | Lim | 327/350 |
| 5,489,868 | 2/1996 | Gilbert | 327/351 |
| 5,805,011 | 9/1998 | Comino | 327/350 |

*Primary Examiner*—Toan Tran
*Attorney, Agent, or Firm*—Darby & Darby

[57] ABSTRACT

A circuit for compensating for the input offset voltage of a logarithmic amplifier includes a digital comparator, a logic circuit, and a digital-to-analog converter (DAC) in a feedback loop. The comparator is connected to the output of the log amplifier and digitally indicates the polarity of the input offset voltage when the amplifier input is set to zero. The logic circuit uses the digital output of the comparator to form an adjustable digital compensation signal. This digital compensation signal is applied to the DAC to generate an analog compensation signal that is injected into the input of the logarithmic amplifier to cancel the input offset voltage. The process is repeated until the proper or best compensation signal is produced.

13 Claims, 3 Drawing Sheets

OFFSET COMPENSATION CIRCUIT FOR INTEGRATED LOGARITHMIC AMPLIFIERS

TECHNICAL FIELD

This invention relates to an offset compensation circuit, and more particularly, to an offset compensation circuit for use with an integrated logarithmic amplifier.

BACKGROUND OF THE INVENTION

The main feature of a logarithmic amplifiers is its non-linear transfer characteristic. This type of amplifier expands the dynamic range of small input signals and compresses that of large input signals. A common problem with integrated logarithmic amplifiers is that they saturate very easily. This is due to the fact that they amplify their own input offset voltages. Because of the very large gain in the small signal range, even a small input offset voltage creates a large output signal, thus reducing the available dynamic range for the input. Therefore, it is often necessary to compensate for the input offset voltage.

A conventional approach is to use resistor trimming to cancel the input offset voltage of the amplifier. However, resistor trimming is an expensive procedure. Furthermore, this technique is static. Although it can compensate for input offset voltages caused by process variations, it can only cancel the input offset voltage at the temperature at which trimming was performed. As a consequence, this resistor trimming technique does not compensate for changes in the input offset voltage as a result of changes in the temperature of the integrated circuit.

SUMMARY OF THE INVENTION

An offset compensation circuit for a logarithmic amplifier according the present invention generates an offset compensation signal by a combination analog/digital feedback loop and injects the compensation signal into the input of the logarithmic amplifier. The circuit is comprised of a comparator, a logic circuit, and a digital-to-analog converter (DAC). The logic circuit generates a digital compensation signal which is input to the DAC converter and converted into the injected analog compensation signal. During the compensation process, the input of the amplifier is set to zero and the comparator is connected to the output of the amplifier. The output of the amplifier is the amplified input offset voltage combined with the injected compensation signal. Thus, the comparator output indicates whether the injected signal is too large or too small (i.e., whether the circuit is over or undercompensating).

This comparator output signal is input to the logic circuit which generates the value of the digital compensation signal, which is adjusted to create a zero output from the comparator. The adjusted digital compensation signal is converted to an analog value and is injected into the input of the logarithmic amplifier as an injected compensation signal. The process repeats until the injected compensation signal cancels the input offset voltage. Once the proper digital compensation signal has been generated, its value may be stored in a buffer. This allows the unused compensation logic to be shut down to conserve power. Alternately, the logic shared among several amplifiers and used to generate digital compensation values for them in succession or as needed.

BRIEF DESCRIPTION OF THE DRAWINGS

The foregoing and other features of the present invention will be more readily apparent from the following detailed description and drawings of illustrative embodiments of the invention in which.

DETAILED DESCRIPTION

Figure 1:
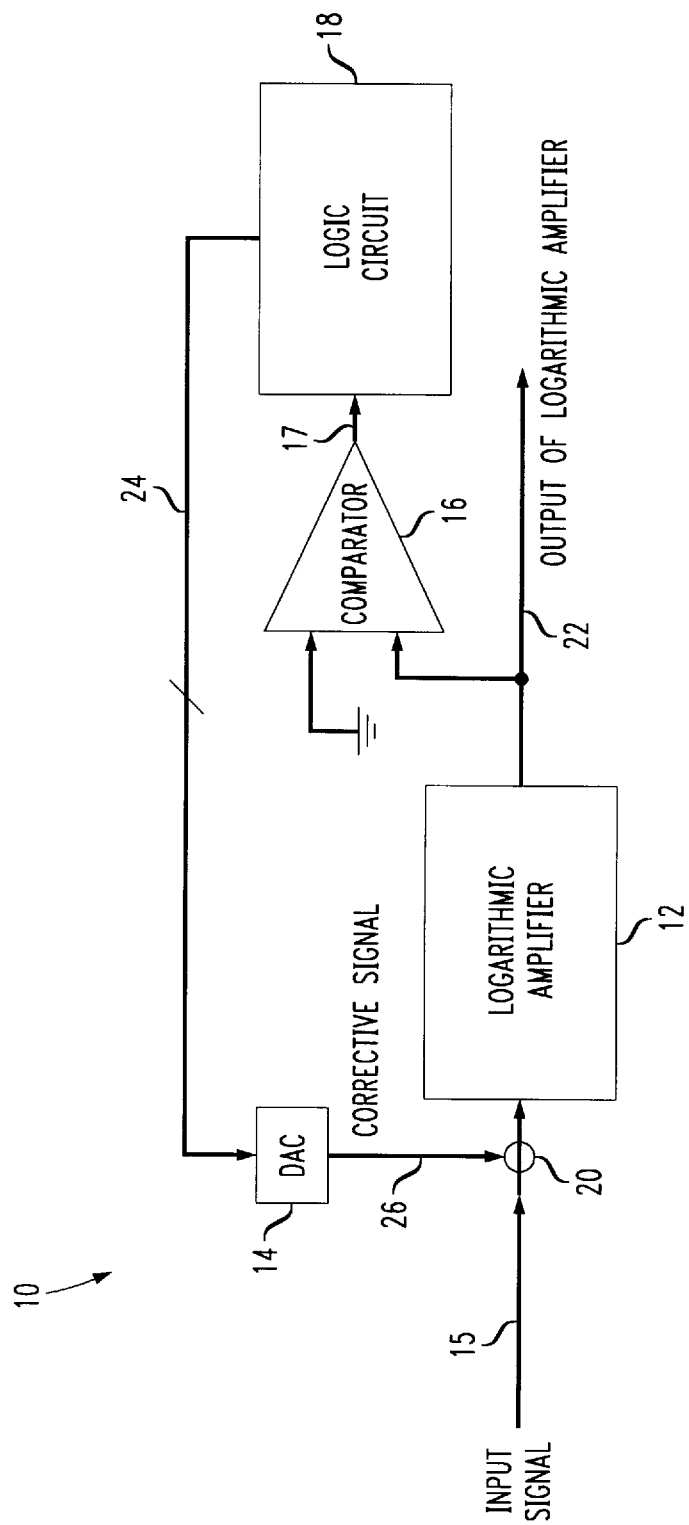
FIG. 1 shows a block diagram of an offset compensation circuit according to the present invention.

FIG. 1 is a block diagram of an offset compensation circuit 10 for a logarithmic amplifier 12 according to the present invention. Compensation circuit 10 is comprised of a digital-to-analog converter 14 (DAC), a comparator 16, and a logic circuit 18. The logic circuit 18 generates a digital compensation signal 24 in response to the output 17 of the comparator 16 during the offset compensation process. This digital compensation signal 24 is input to the DAC 14 where it is converted to an analog compensation signal 26. Signal 26 is injected into the amplifier at node 20 to compensate for the input offset voltage of the amplifier 12. The amount of compensation is adjusted by logic circuit 18 through a feedback mechanism.

To compensate for an input offset voltage, the input signal 15 of the amplifier 12 is first set to zero (e.g., ground). Ideally, the output 22 of the amplifier 12 should also be the local ground (e.g., the zero-value). In practice, the output will be the logarithmically amplified input offset voltage and will be either positive or negative relative to the local ground depending on the value of the input offset voltage. Amplifier output 22 is compared to the ideal zero value by comparator 16 and therefore the output 17 of comparator 16 indicates whether the present input offset voltage is too high or too low and, by extension, indicates whether the injected correction signal is too large or too small. This information is used by logic circuit 18 to adjust the digital compensation signal 24 a fixed amount, thereby adjusting the injected analog compensation signal 26. The offset compensation procedure is repeated until the final compensation signal 26 cancels the input offset voltage to the maximum degree possible by the resolution of the DAC 14.

The DAC 14 should be configured to have a maximum output voltage or current range sufficient to compensate for the largest expected input offset signal for all normal process and temperature variations. For example, if the worst-case input offset is a voltage of $\pm 2$ mV (a 4 mV range), the DAC 14 should also have an output range of substantially $\pm 2$ mV. If an 8-bit DAC with this output range is used in the compensation circuit, the circuit would be able to compensate for input offset voltages as small as 62.5 $\mu$V (i.e., 4 mV$\div$64 steps). While the input offset voltage would not be exactly canceled by the offset correction signal 26, the degree of cancellation achieved with a 6 or 8-bit DAC is sufficient for most application. Accuracy can be easily increased by using a DAC with a better resolution.

Because the gain of amplifier 12 is very large for small input voltages, and speed is not an issue in many circumstances during the compensation process, the comparator 16 and DAC 14 can be relatively low precision components. The circuit used to inject the compensation signal 26 from DAC 14 into input signal 15 will depend on the construction of the logarithmic amplifier 12 and on whether the signal will be injected as a current or a voltage. Various techniques for injecting signals are well known to those skilled in the art.

Figure 2:
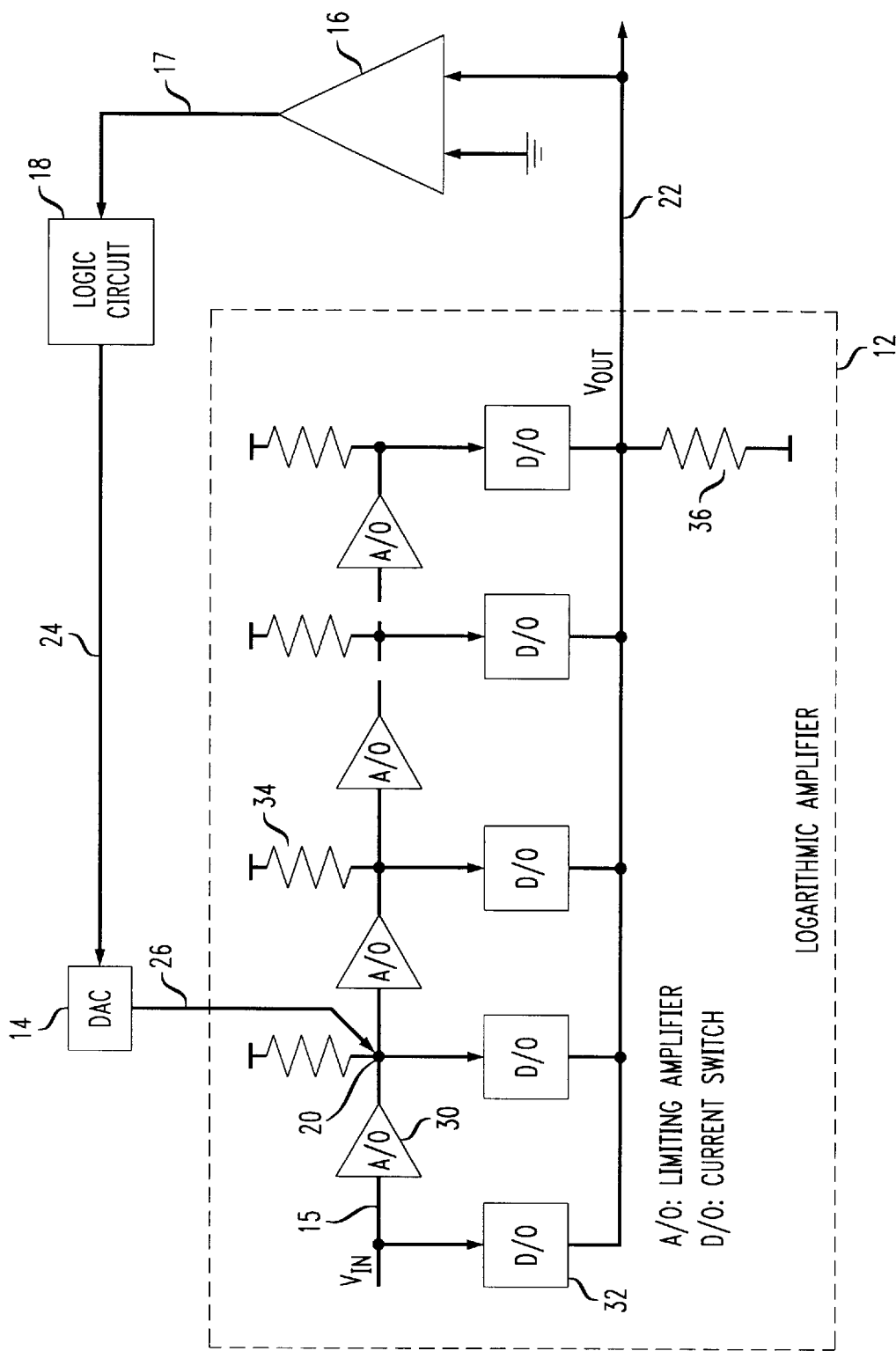
FIG. 2 is a simplified schematic drawing showing the injection into a conventional logarithmic amplifier of a compensation signal generated by the circuit of FIG. 1.

One example of a conventional logarithmic amplifier design and how an input offset voltage compensation signal generated according to the present invention may be injected is illustrated in FIG. 2. The logarithmic amplifier 12 is comprised of several stages of limiting amplifiers 30, current switches 32, pull-up resistors 34. The output of each stage is summed and the total current is converted to a voltage output by output resistor 36. As the input voltage increases, each amplifier stage saturates in turn, reducing the effect of higher voltages on the output and therefore producing a logarithmic response. The injected corrective signal is a current which is sourced or sunk by DAC 14 through node 20 as illustrated.

Figure 3:
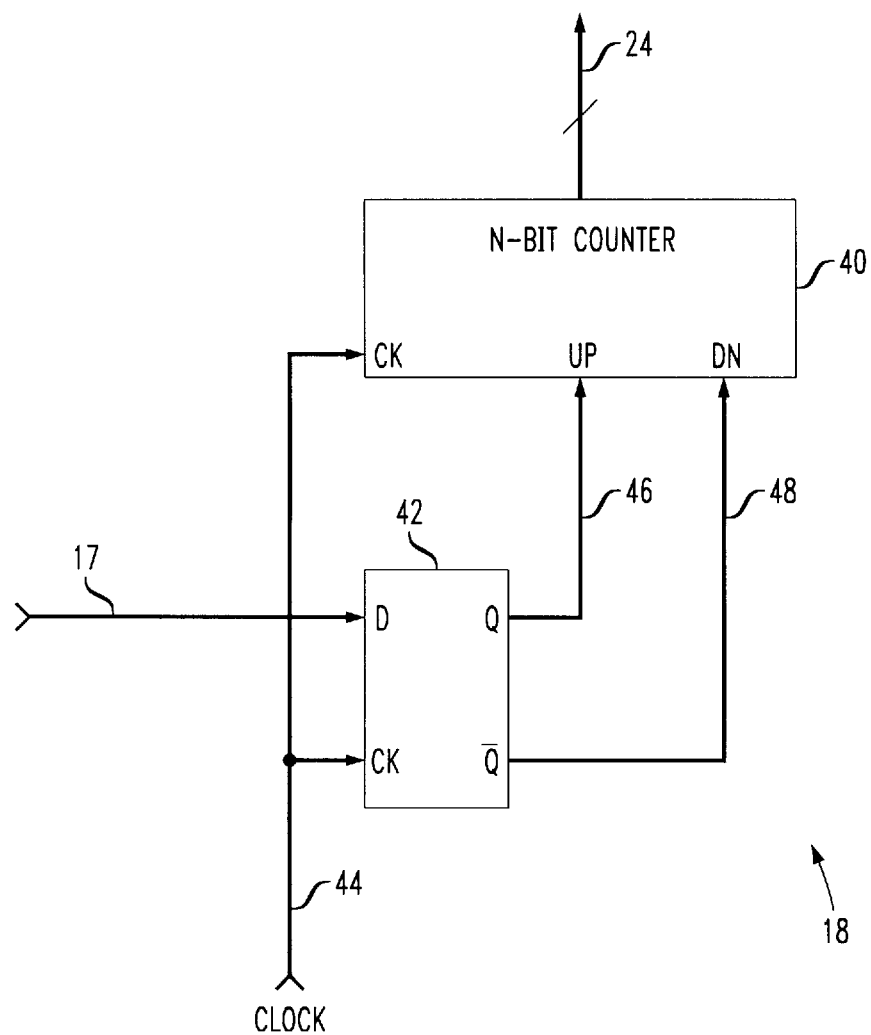
FIG. 3 is a schematic diagram of one embodiment of the logic circuit in the circuits of FIGS. 1 and 2.

Various strategies can be used to adjust DAC 14 during the offset compensation process and the design of the logic circuit 18 is dependent on the method chosen. FIG. 3 illustrates one embodiment based on an incremental method of compensation. In this embodiment, logic circuit 18 is comprised of an N-bit up/down counter 40 driven by the outputs 46, 48 of D-type flip-flop 42. Flip-flop 42 captures the input signal 17 at each cycle of the clock signal 44. The comparator 16 is configured to have a voltage output that corresponds to either a logic high or logic low, according to the results of the comparison. Depending on the type and polarity of logic circuitry used and on the output range of comparator 16, additional circuitry (not shown) may be needed to level shift the output 17 of the comparator 16 to appropriate logic high or low signals.

Depending on whether input signal 17 is a logic high or logic low, the counter 40 will be incremented or decremented the following clock cycle. After a number of clock cycles, the circuit's output will oscillate between the two values which most closely cancel the input offset voltage. It can take several microseconds for the adjusted signal to propagate through the rest of the compensation circuit 10 and amplifier 12 and the clock frequency should be chosen accordingly. Offset compensation may be started or stopped by enabling or disabling the clock signal.

Other methods to adjust the value of the injected compensation signal may also be used. For example, a value for the digital compensation signal can be determined by successive approximation where each bit of the digital value, working from the most significant bit to the least significant bit, is set one at a time to see whether the resulting digital value is too high or too low. Appropriate logic control circuits can easily be designed by one skilled in the art using conventional techniques. Offset compensation may be done whenever the amplifier 12 is idle, e.g., when the chip is first powered up. It may also be done continuously during subsequent idle times to compensate for temperature drift.

The circuit 10 according to the present invention thus provides a simple and inexpensive way to automatically compensate for an input offset voltage of a logarithmic amplifier over all expected temperature and process variations without having to directly measure the offset voltage. The circuit 10 may be implemented separately from the log amplifier 12 or the two may be combined as a single integrated circuit. Further, one skilled in the art would recognize that comparator 16 and logic circuit 18 may be shared among several different logarithmic amplifiers if desired by providing appropriate switches and storage areas to retain the final digital compensation signal 24 determined by logic circuit 18 at the end of the offset compensation process.

While the invention has been particularly shown and described with reference to preferred embodiments thereof, it will be understood by those skilled in the art that various changes in form and details may be made therein without departing from the spirit and scope of the invention.

We claim:

1. An input offset compensation circuit for a logarithmic amplifier comprising:
    a comparator circuit receiving the output of said logarithmic amplifier and a reference voltage, wherein said reference voltage is substantially the ideal output of said logarithmic amplifier when said amplifier input is at a predetermined level, said comparator producing a digital signal related to a comparison of the amplifier output and reference voltage when said amplifier input is at the predetermined level;
    a logic circuit receiving the digital signal from said comparator and generating a digital compensation signal in response thereto, said logic circuit adjusting the value of said digital compensation signal according to said comparator output; and
    a digital to analog convertor which converts the digital compensation signal into an analog compensation signal, said analog compensation signal being injected into the input of said logarithmic amplifier to compensate for the input offset.

2. The compensation circuit of claim 1, wherein said analog compensation signal is injected into the input of said logarithmic amplifier as a current.

3. The compensation circuit of claim 1, wherein said analog compensation signal is injected into the input of said logarithmic amplifier as a voltage.

4. The compensation circuit of claim 1, wherein said logic circuit adjusts the value of said digital compensation signal during calibration by successive approximation.

5. The compensation circuit of claim 1, wherein said logic circuit adjusts the value of said digital compensation signal incrementally.

6. The compensation circuit of claim 5, wherein said logic circuit comprises a counter.

7. The compensation circuit of claim 1, wherein said predetermined level and said reference voltage are zero volts.

8. A logarithmic amplifier circuit comprising:
    a logarithmic amplifier with an input and an output; and
    an input offset compensation circuit receiving the output of said amplifier and injecting an analog compensation signal into the input of said amplifier; said compensation circuit comprising:
        a comparator circuit receiving the output of said amplifier and a reference voltage, wherein said reference voltage is substantially the ideal output of said logarithmic amplifier when said amplifier input is at a predetermined level, said comparator producing a digital signal related to a comparison of the amplifier output and reference voltage when said amplifier input is at the predetermined level;
        a logic circuit receiving said comparator output and generating a digital compensation signal in response thereto, wherein said digital compensation signal is adjusted according to said comparator output; and
        a digital to analog convertor which converts the digital compensation signal into said analog compensation signal.

9. A method of compensating for an input offset signal in a logarithmic amplifier, comprising the steps of:
    a. setting the input of said logarithmic amplifier to a predetermined level;
    b. determining whether the output of said logarithmic amplifier is above or below a reference voltage and generation of a digital signal indicative thereof;

c. generating one of a positive or negative change in a stored digital compensation value;

d. converting the digital compensation value into an analog compensation signal;

e. injecting said analog compensation signal into the input of said logarithmic amplifier;

f. repeating steps b–e until said digital compensation signal stabilizes at or around one value.

10. The method of claim 9, wherein the step of generating comprises incrementally changing the value of said digital compensation signal.

11. The method of claim 9, wherein the step of generating comprises setting the value of said digital compensation signal by a successive approximation method.

12. The method of claim 9, wherein the step of determining comprises comparing the output of said logarithmic amplifier to substantially the ideal output value of said amplifier when the predetermined input level to said amplifier input is zero.

13. The method of claim 12, wherein said step of determining is performed with a comparator.

* * * * *